United States Patent
Liu et al.

(10) Patent No.: US 7,314,816 B2
(45) Date of Patent: Jan. 1, 2008

(54) MASKING LAYER IN SUBSTRATE CAVITY

(75) Inventors: Jwei Wien Liu, Plano, TX (US); John P. O'Connor, Fort Worth, TX (US)

(73) Assignee: Texas Instruments Incorporated, Dallas, TX (US)

(*) Notice: Subject to any disclaimer, the term of this patent is extended or adjusted under 35 U.S.C. 154(b) by 19 days.

(21) Appl. No.: 11/070,547

(22) Filed: Mar. 1, 2005

(65) Prior Publication Data
US 2005/0158918 A1 Jul. 21, 2005

Related U.S. Application Data

(62) Division of application No. 10/186,441, filed on Jul. 1, 2002, now Pat. No. 6,876,071.

(60) Provisional application No. 60/301,985, filed on Jun. 30, 2001.

(51) Int. Cl.
*H01L 21/44* (2006.01)
(52) U.S. Cl. ...................... 438/612; 438/666
(58) Field of Classification Search ................ 257/704, 257/678; 438/125, 666, 612
See application file for complete search history.

(56) References Cited

U.S. PATENT DOCUMENTS

| | | | |
|---|---|---|---|
| 4,445,274 A | 5/1984 | Suzuki et al. | |
| 4,888,449 A | 12/1989 | Crane et al. | |
| 5,639,990 A | 6/1997 | Nishihara et al. | |
| 5,805,427 A * | 9/1998 | Hoffman | 361/770 |
| 6,060,779 A * | 5/2000 | Machii | 257/73 |
| 6,300,673 B1 | 10/2001 | Hoffman et al. | |
| 6,459,149 B1 | 10/2002 | Shimoe et al. | |
| 6,612,027 B2 * | 9/2003 | Akram | 29/843 |
| 6,630,661 B1 | 10/2003 | Hoffman | |
| 6,707,168 B1 | 3/2004 | Hoffman et al. | |
| 6,781,231 B2 | 8/2004 | Minervini | |
| 6,841,412 B1 | 1/2005 | Fisher et al. | |

\* cited by examiner

*Primary Examiner*—Roy Potter
(74) *Attorney, Agent, or Firm*—Charles A. Brill; Wade James Brady, III; Frederick J. Telecky, Jr.

(57) ABSTRACT

A package that resists creation of particles in a package cavity. A package according to one embodiment of the present invention contains a mechanical device attached to the floor of the package substrate. Epoxy typically is used to attach the device. Electrical connections are provided by bond wires connecting bond pads on the substrate with bond pads on the device. A window is attached to the substrate to form a cavity around the device. A thin masking layer on portions of the package cavity surface prevents the surface from generating particles. The thin masking layer may be any material that resists particle generation. The masking layer on the cavity walls optionally extends out of the cavity and onto the upper surface of the package.

19 Claims, 2 Drawing Sheets

MASKING LAYER IN SUBSTRATE CAVITY

This application is a Divisional of application Ser. No. 10/186,441, filed Jul. 1, 2002 and Provisional Application Ser. No. 60/301,985, filed Jun. 30, 2001.

FIELD OF THE INVENTION

This invention relates to the field of semiconductor packaging, more particularly to packaging of micro-electro-optical systems (MEOMS) and micro-electro-mechanical systems (MEMS).

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

Micromirror devices are a type of micromechanical device. Micromirror devices are primarily used in optical display systems. In display systems, the micromirror is a light modulator that uses digital image data to modulate a beam of light by selectively reflecting portions of the beam of light to a display screen. Other types of micromechanical devices include accelerometers, pressure and flow sensors, gears and motors. While some micromechanical devices, such as pressure sensors, flow sensors, and micromirrors have found commercial success, other types have not yet been commercially viable.

Packaging MEOMS and MEMS presents special challenges. In the case of the micromirror device, the package must provide a hermetically, or near-hermetically sealed environment while providing a distortion-free optical path to the surface of the device and a large number of electrical connections to the device. The package must also be robust enough to withstand extreme thermal gradients when the micromirror array is illuminated by a high optical flux beam.

Furthermore, the package must not create particles during the life of the device. Particles generated within the device can enter the moving superstructure of the MEMS device and electrically short circuit portions of the device or mechanically block the movement of the moving parts. Because of the moving parts and the requirement for some devices to maintain an optical path with the device in the package, the package cavity cannot simply be filled with a potting compound.

Ceramic substrates are preferred for micromirror devices because they provide a good barrier against moisture entering the package. Additionally, ceramic substrates are mechanically robust, allowing them to withstand stresses generated by uneven heating that occurs when the micromirror is illuminated. Unfortunately, ceramic substrates generate particles that can destroy the packaged devices. What is needed is a method and system for preventing particle generation by ceramic package substrates.

SUMMARY OF THE INVENTION

Objects and advantages will be obvious, and will in part appear hereinafter and will be accomplished by the present invention which provides a method and system for coating the inside of a ceramic package substrate to prevent particle generation. One embodiment of the claimed invention provides a method of forming a package substrate. The method comprising: forming a substrate, the substrate having a cavity; and coating portions of the cavity surface with a masking layer.

Another embodiment of the present invention provides a package. The package comprising: a substrate having an upper surface and a cavity surface formed therein, the cavity having at least one wall surface and at least one floor surface; a device attached to the cavity floor; a lid attached to the upper surface enclosing the device; and a masking layer on at least a portion of the cavity surface.

Yet another embodiment of the present invention provides a package substrate. The package substrate comprising: a substrate having an upper surface and a cavity surface formed therein, the cavity having at least one wall surface and at least one floor surface; and a masking layer on at least a portion of the cavity surface.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The present invention provides an improved package and package substrate that is useful for packaging of MEMS devices. Particle generation by the substrate is reduced by the application of a liner over the inner ceramic surfaces. The liner is particularly useful when applied over the rough edges of the substrate cavity wall and over the sharp edges of the substrate.

Figure 1:
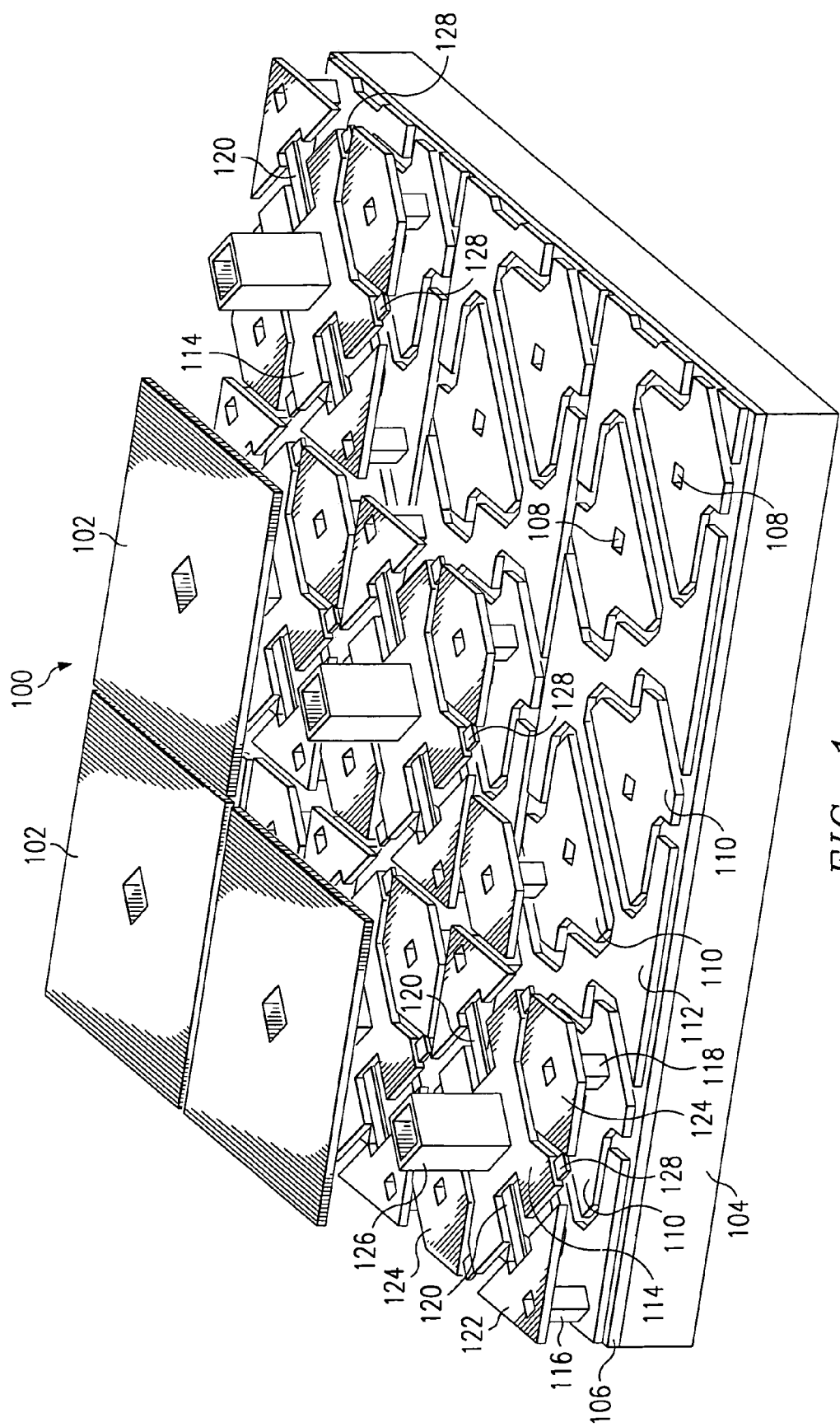
FIG. 1 is a perspective view of a small portion of a micromirror array of the prior art.
Figure 2:
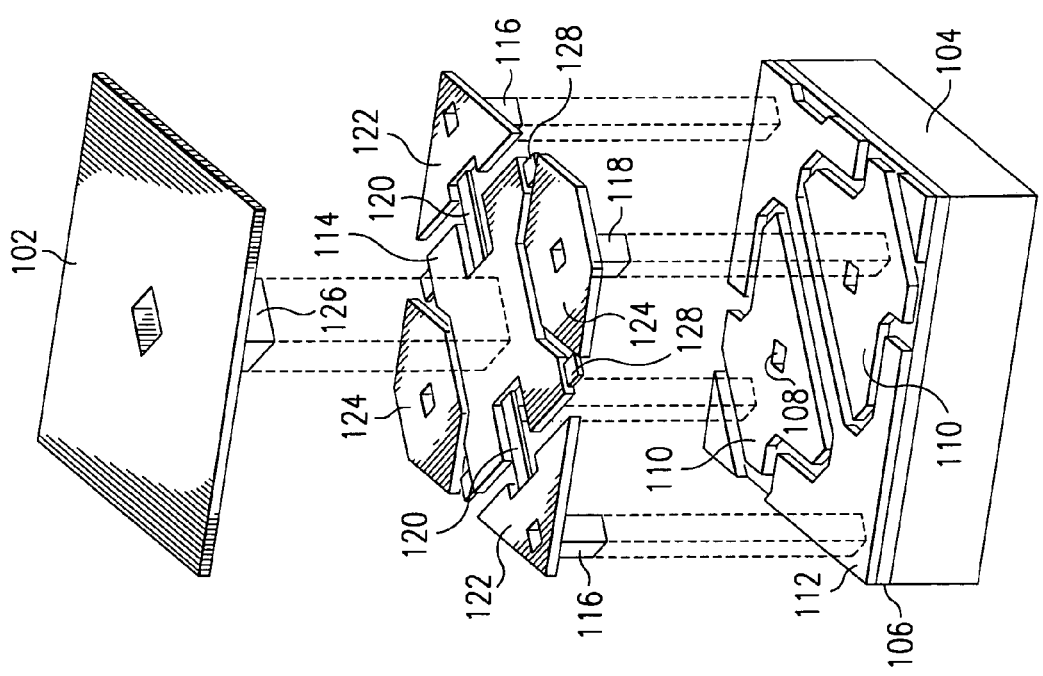
FIG. 2 is an exploded perspective view of a single micromirror element from the micromirror array of FIG. 1.

The improved package substrate of the present invention is particularly useful when used to package micromirror devices such as the one shown in FIGS. 1 and 2. As shown in FIG. 1, a typical hidden-hinge micromirror 100 is actually an orthogonal array of micromirror cells, or elements. This array often includes more than a thousand rows and columns of micromirrors. FIG. 1 shows a small portion of a micromirror array of the prior art with several mirrors 102 removed to show the underlying mechanical structure of the micromirror array. FIG. 2 is an exploded view of a single micromirror element of the prior art further detailing the relationships between the micromirror structures.

A micromirror is fabricated on a semiconductor, typically silicon, substrate 104. Electrical control circuitry is typically fabricated in or on the surface of the semiconductor substrate 104 using standard integrated circuit process flows. This circuitry typically includes, but is not limited to, a memory cell associated with, and typically underlying, each mirror 102 and digital logic circuits to control the transfer of the digital image data to the underlying memory cells. Voltage driver circuits to drive bias and reset signals to the mirror superstructure may also be fabricated on the micromirror substrate, or may be external to the micromirror.

Image processing and formatting logic is also formed in the substrate 104 of some designs.

The silicon substrate 104 and any necessary metal interconnection layers are isolated from the micromirror superstructure by an insulating layer 106 which is typically a deposited silicon dioxide layer on which the micromirror superstructure is formed. Holes, or vias, are opened in the oxide layer to allow electrical connection of the micromirror superstructure with the electronic circuitry formed in the substrate 104.

Address electrodes 110 and a mirror bias connection 112 are formed from a metal layer deposited on the insulating layer 106. Some micromirror designs have separate and distinct landing electrodes that are electrically connected to the mirror bias connection 112. Landing electrodes limit the rotation of the mirror 102 and prevent the rotated mirror 102 or hinge yoke 114 from touching the address electrodes 110, which have a voltage potential relative to the mirror 102. If the mirror 102 contacts the address electrodes 110, the resulting short circuit could fuse the torsion hinges 120 or weld the mirror 102 to the address electrodes 110, in either case ruining the micromirror. Since the same voltage is always applied both to the landing electrodes and the mirrors 102, the mirror bias connection and the landing electrodes are combined in a single structure when possible. The landing electrodes are combined with the mirror bias connection 112 by including regions on the mirror bias/reset connection 112, called landing sites, which mechanically limit the rotation of the mirror 102 by contacting either the mirror 102 or the torsion hinge yoke 114. These landing sites are often coated with a material chosen to reduce the tendency of the mirror 102 and torsion hinge yoke 114 to stick to the landing site.

Hinge support spacervias 116 and upper address electrode spacervias 118, typically extend approximately 1 μm above the address electrodes 110 and mirror bias connections 112. A hinge cap 122 and upper address electrodes 124 are supported by the hinge support spacervias 116 and upper address electrode spacervias 118. The hinge cap 122 anchors the ends of torsion hinges 120. A hinge yoke 114 is formed between and supported by the torsion hinges 120. The hinge yoke 114 is allowed to rotate by twisting the thin torsion hinges 120. A mirror support spacervia 126 is formed on the hinge yoke, and supports a mirror 102 approximately 2 μm above the hinge yoke 114.

Electrostatic attraction between an address electrode 110 and a deflectable rigid member, which in effect form the two plates of an air gap capacitor, is used to rotate the mirror structure. Depending on the design of the micromirror device, the deflectable rigid member is the torsion beam yoke 114, the beam or mirror 102, a beam attached directly to the torsion hinges, or a combination thereof. The upper address electrodes 124 also electrostatically attract the deflectable rigid member.

Figure 3:
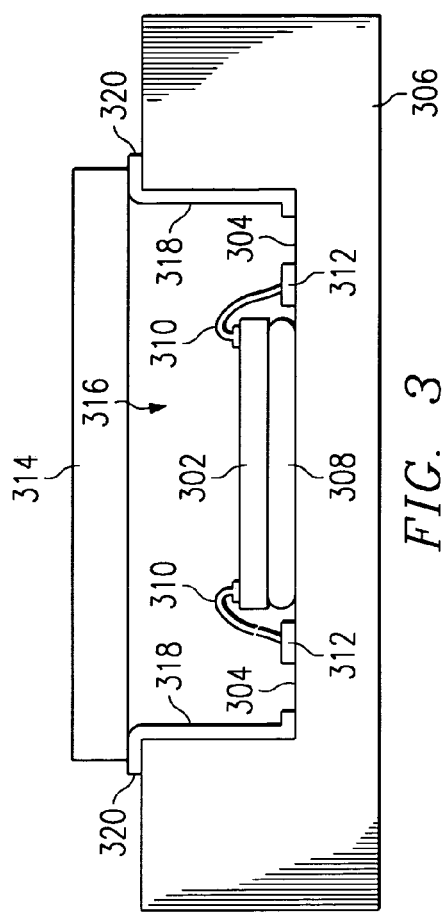
FIG. 3 is a cross section side view of a micromechanical device in a package according to one embodiment of the present invention.

FIG. 3 is a cross section side view of a micromechanical device, in a package according to one embodiment of the present invention. The mechanical device 302, for example a micromirror device, is attached to the floor 304 of the package substrate 306, typically by epoxy 308. Electrical connections are provided by bond wires 310 connecting bond pads 312 on the substrate with bond pads on the device 302. A window 314 is attached to the substrate 306 to form a cavity 316 around the device.

Ceramic is the material of choice for hermetic device package substrates. Unfortunately, ceramic substrates create many particles that can destroy the MEMS device. Of particular concern are the sharp edges and cavity walls. The sharp edges create particles because the concentration of forces on the thin sharp edge makes it easy for particles to break away from the edge. The exterior edges of the ceramic substrate are chamfered to prevent this. Unfortunately, there is no automated process for chamfering the inner edges of the cavity.

A second particle-rich area is the rough cavity wall. Not only does the rough surface of the inner cavity wall harbor particles, the rough surface creates many points susceptible, like the sharp edges mentioned above, to fracture. Furthermore, the rough edges are often fractured during substrate manufacture leaving particles that can easily break free. Current processes use a chemical process to smooth the inner cavity wall. This is a manual process and is expensive and time consuming to perform. The surfaces of the package cavity not only are difficult to clean, and therefore likely to harbor and create particles, but any particles created by the cavity surfaces will be captured in the sealed package where they are likely eventually to damage the packaged device.

A solution to the particle generation problem is to apply a thin masking layer 318 to the portions of the package cavity surface that source particles. The thin masking layer may be any material that resists particle generation. Malleable metals are ideal. For example, gold plating on the inner cavity walls bonds well to the ceramic surfaces, captures particles that are already loose, and resists chipping to avoid the generation of additional particles. A further benefit of gold plating is the ability of gold, as well as many other metals, to withstand the lubricants often used in MEMS packages. For example, the perfluordecanoic acid used in micromirror packages. Since gold is already used to form the bond pads 312 on the cavity floor, the additional steps need to add the plating to the cavity walls are minimal.

As shown in FIG. 3, the masking layer 318 on the cavity walls extends out of the cavity and onto the upper surface of the package. Although this extension 320 is not necessary, it does make it easier to completely enclose the upper sharp edge of the cavity. The extension 320 may also be used to attach the window 314, in the case of a micromirror package, or lid.

Figure 4:
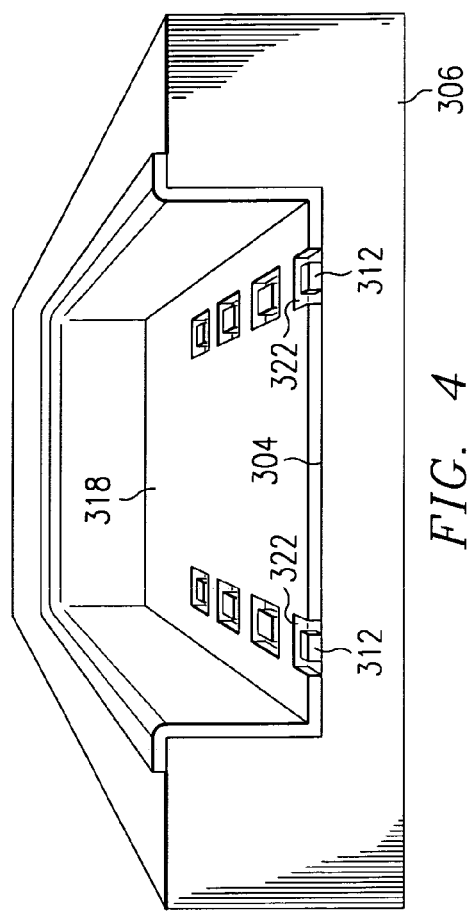
FIG. 4 is a perspective view of a portion of a ceramic substrate according to one embodiment of the present invention.

FIG. 4 is a perspective view of a portion of a ceramic substrate according to one embodiment of the present invention. In FIG. 4, the masking layer 318 extends across the floor 304 of the package cavity. Thus, the masking layer nearly covers the entire substrate in the cavity. When a conductive masking layer 318 is used, for example a metal layer, gaps must be formed between the bond pads 312 and the masking layer 318.

The masking layer described above may be applied in a number of ways. For example, a metal masking layer may be sputtered over the cavity surface, with areas masked to prevent bonding with the substrate. The masking layer may also be plated on the surface. Other masking materials, such as epoxy, lend themselves to methods of spraying or brushing the masking layer onto the surface of the cavity. Excess masking materials may be removed by chemical processes, such as various etch steps, or by laser etching.

Thus, although there has been disclosed to this point a particular embodiment for a masking layer in a substrate cavity and method therefore, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims. In the following claims, only elements denoted by the words "means for" are intended to be interpreted as means plus function claims under 35 U.S.C. § 112, paragraph six.

What is claimed is:

1. A method of forming a package substrate comprising:
   forming a substrate, said substrate having a cavity;
   forming bond pads on a surface of said cavity; and
   coating portions of said cavity surface with a masking layer.

2. The method of claim 1, said forming a substrate comprising forming a ceramic substrate.

3. The method of claim 1, said coating comprising coating portions of said cavity surface selected from a group consisting of a wall of said cavity and a floor of said cavity with said masking layer.

4. The method of claim 1, said coating comprising coating portions of said cavity surface with a masking layer selected from a group consisting of metal, gold, and epoxy.

5. The method of claim 1, said coating comprising coating portions of said cavity surface using a process selected from a group consisting of sputtering plating, spraying, and brushing.

6. The method of claim 1, said coating comprising coating portions of said cavity surface with a masking layer extending onto an upper surface of said substrate.

7. The method of claim 1, comprising removing portions of said masking layer by a process selected from the group consisting of chemical etching and laser etching.

8. A method of forming a package substrate comprising:
   forming a substrate, said substrate having a cavity; and
   coating portions of said cavity surface with a metal masking layer by a process selected from the group consisting of sputtering and plating.

9. The method of claim 8, said forming a substrate comprising forming a ceramic substrate.

10. The method of claim 8, said coating portions comprising coating portions of said cavity with a gold metal masking layer.

11. The method of claim 8, said coating portions comprising coating portions of said cavity selected from the group consisting of walls and a floor of said cavity.

12. The method of claim 8, said coating portions comprising coating portions of said cavity and an upper surface of said substrate with said metal masking layer.

13. The method of claim 8, comprising removing portions of said metal masking layer by a process selected from the group consisting of chemical etching and laser etching.

14. A method of forming a package substrate comprising:
    forming a substrate, said substrate having a cavity; and
    coating portions of said cavity surface with an epoxy masking layer.

15. The method of claim 14, said forming a substrate comprising forming a ceramic substrate.

16. The method of claim 14, said coating portions comprising coating portions of said cavity selected from the group consisting of walls and a floor of said cavity.

17. The method of claim 14, said coating portions comprising coating portions of said cavity and an upper surface of said substrate with said epoxy masking layer.

18. The method of claim 14, said coating portions comprising coating portions using an application process selected from the group consisting of brushing and spraying.

19. The method of claim 14, comprising removing portions of said epoxy masking layer by a process selected from the group consisting of chemical etching and laser etching.

* * * * *